United States Patent
Iida et al.

(10) Patent No.: US 8,743,934 B2
(45) Date of Patent: Jun. 3, 2014

(54) SIGNAL MEASUREMENT DEVICE, SIGNAL MEASUREMENT METHOD, AND RECORDING MEDIUM

(75) Inventors: Minoru Iida, Saitama (JP); Takashi Kimura, Saitama (JP)

(73) Assignee: Advantest Corporation, Tokyo (JP)

( * ) Notice: Subject to any disclaimer, the term of this patent is extended or adjusted under 35 U.S.C. 154(b) by 40 days.

(21) Appl. No.: 13/484,418

(22) Filed: May 31, 2012

(65) Prior Publication Data

US 2012/0327990 A1 Dec. 27, 2012

(30) Foreign Application Priority Data

Jun. 23, 2011 (JP) ................................. 2011-139579

(51) Int. Cl.
*H04B 17/00* (2006.01)

(52) U.S. Cl.
USPC ........... 375/224; 375/316; 375/225; 375/226; 375/227; 375/228; 375/346

(58) Field of Classification Search
USPC .......... 375/224, 316, 225, 226, 227, 228, 346
See application file for complete search history.

(56) References Cited

U.S. PATENT DOCUMENTS

| | | | | |
|---|---|---|---|---|
| 4,700,129 A * | 10/1987 | Yoshizawa et al. | ......... | 324/76.77 |
| 4,890,056 A * | 12/1989 | Peters et al. | ............... | 324/76.82 |
| 6,060,878 A | 5/2000 | Doi | | |
| 7,477,881 B2 * | 1/2009 | Kim | .............................. | 455/130 |
| 7,580,680 B2 * | 8/2009 | Isaac et al. | ................. | 455/67.11 |
| 8,090,011 B2 * | 1/2012 | Asami | ........................... | 375/226 |
| 2006/0068739 A1 * | 3/2006 | Maeda et al. | ................. | 455/295 |
| 2007/0097271 A1 * | 5/2007 | Gao et al. | ...................... | 348/724 |
| 2010/0013709 A1 * | 1/2010 | Schlee et al. | .................. | 342/372 |

FOREIGN PATENT DOCUMENTS

JP 10-282163 10/1998

* cited by examiner

*Primary Examiner* — Siu Lee
(74) *Attorney, Agent, or Firm* — Greenblum & Bernstein, P.L.C.

(57) ABSTRACT

In a signal measurement device, a plurality of mixers output a signal having a frequency equal to a difference between two input frequencies, and a single local signal source feeds a common local signal input to the plurality of mixers. A difference measurement unit measures a level and a phase difference between outputs of the plurality of mixers if a common correction signal input is fed to the plurality of mixers, and a level/phase measurement unit measures the level and the phase of the output of the plurality of mixers if inputs of signal to be measured common in frequency are fed to the plurality of mixers. A difference correction unit corrects a measurement result of the level/phase measurement unit based on a measurement result of the difference measurement unit if a common input of signal to be measured is fed to the plurality of mixers.

12 Claims, 8 Drawing Sheets

| Local Frequency $f_{Lo1}$ | Level [dBm] | | Level Difference [dBm] | Phase [rad] | | Phase Difference [rad] |
|---|---|---|---|---|---|---|
| | CH1 | CH2 | CH2-CH1 | CH1 | CH2 | CH2-CH1 |
| $f_1$ | ◯ | ◯ | $\Delta$Lv1 | ◯ | ◯ | $\Delta$P1 |
| $f_2$ | ◯ | ◯ | $\Delta$Lv2 | ◯ | ◯ | $\Delta$P2 |
| $f_3$ | ◯ | ◯ | $\Delta$Lv3 | ◯ | ◯ | $\Delta$P3 |

SIGNAL MEASUREMENT DEVICE, SIGNAL MEASUREMENT METHOD, AND RECORDING MEDIUM

BACKGROUND ART

1. Technical Field of the Invention

The present invention relates to handling of inconsistency in level and phase of local signals in a spectrum analyzer having multiple channels.

2. Related Art

A spectrum analyzer which has two channels (namely, two measurement ports) has conventionally been known (refer to ABSTRACT of a patent document 1 (Japanese Patent Application Laid-open No. Hei 10-282163), for example). Such a spectrum analyzer has independent local signal sources for the respective channels.

Moreover, it is conceivable to simultaneously input the signal output from the same signal source to the respective channels, and to measure the signal using such a spectrum analyzer. In this case, it is necessary for precise measurement that levels and phases of local signals in the respective channels coincide.

SUMMARY OF THE INVENTION

However, there are shifts in initial phase and fluctuation in phase among the local signals in the respective channels, and it is thus difficult to cause the levels and the phases of the local signals in the respective channels to coincide with one another.

In view of the foregoing problem, it is an object of the present invention to handle the inconsistency in level and phase of local signals in respective channels in a spectrum analyzer having multiple channels.

According to the present invention, a signal measurement device includes: a plurality of mixers that output a signal having a frequency equal to a difference between two input frequencies; a single local signal source that feeds a common local signal input to the plurality of mixers; a difference measurement unit that measures a level difference and a phase difference between outputs of the plurality of mixers if a common correction signal input is fed to the plurality of mixers; a level/phase measurement unit that measures the level and the phase of the output of the plurality of mixers if inputs of signal to be measured common in frequency are fed to the plurality of mixers; and a difference correction unit that corrects a measurement result of the level/phase measurement unit based on a measurement result of the difference measurement unit if a common input of signal to be measured is fed to the plurality of mixers.

According to the thus constructed signal measurement device, a plurality of mixers output a signal having a frequency equal to a difference between two input frequencies. A single local signal source feeds a common local signal input to the plurality of mixers. A difference measurement unit measures a level difference and a phase difference between outputs of the plurality of mixers if a common correction signal input is fed to the plurality of mixers. A level/phase measurement unit measures the level and the phase of the output of the plurality of mixers if inputs of signal to be measured common in frequency are fed to the plurality of mixers. A difference correction unit corrects a measurement result of the level/phase measurement unit based on a measurement result of the difference measurement unit if a common input of signal to be measured is fed to the plurality of mixers.

According to the signal measurement device of the present invention, the difference measurement unit may measure the level difference and the phase difference while the level difference and the phase difference are associated with a frequency of the local signal input; and the difference correction unit may correct the measurement result of the level/phase measurement unit according to the frequency of the local signal input.

According to the signal measurement device of the present invention, the difference correction unit may correct the measurement result of the level/phase measurement unit based on the measurement result of the difference measurement unit interpolated in terms of the frequency of the local signal input.

According to the present invention, the signal measurement device may include a mixer for correction signal that receives the local signal input and an intermediate frequency signal input, and outputs a signal having a frequency equal to a sum of the frequency of the local signal input and the frequency of the intermediate frequency signal input as the correction signal.

According to the present invention, the signal measurement device may include: independent local signal sources that are respectively associated with the plurality of mixers; and a switch that connects the plurality of mixers respectively with the single local signal source or the independent local signal sources.

According to the present invention, the signal measurement device may include: a plurality of mixers that output a signal having a frequency equal to a difference between two input frequencies; a single local signal source that feeds a common local signal input to the plurality of mixers; and a level/phase measurement unit that measures the level and the phase of the output of the plurality of mixers if inputs of signal to be measured common in frequency is fed to the plurality of mixers, wherein there are no level difference and no phase difference between outputs of the plurality of mixers if a common input of signal to be measured is fed to the plurality of mixers.

The present invention is a signal measurement method using a signal measurement device including: a plurality of mixers that output a signal having a frequency equal to a difference between two input frequencies; and a single local signal source that feeds a common local signal input to the plurality of mixers; the method including: a difference measurement step that measures a level difference and a phase difference between outputs of the plurality of mixers if a common correction signal input is fed to the plurality of mixers; a level/phase measurement step that measures the level and the phase of the output of the plurality of mixers if inputs of signal to be measured common in frequency are fed to the plurality of mixers; and a difference correction step that corrects a measurement result of the level/phase measurement step based on a measurement result of the difference measurement step if a common input of signal to be measured is fed to the plurality of mixers.

The present invention is a program of instructions for execution by a computer to perform a signal measurement process using a signal measurement device including: a plurality of mixers that output a signal having a frequency equal to a difference between two input frequencies; and a single local signal source that feeds a common local signal input to the plurality of mixers; the process including: a difference measurement step that measures a level difference and a phase difference between outputs of the plurality of mixers if a common correction signal input is fed to the plurality of mixers; a level/phase measurement step that measures the level and the phase of the output of the plurality of mixers if inputs of signal to be measured common in frequency are fed to the plurality of mixers; and a difference correction step that corrects a measurement result of the level/phase measurement step based on a measurement result of the difference measurement step if a common input of signal to be measured is fed to the plurality of mixers.

The present invention is a computer-readable medium having a program of instructions for execution by a computer to perform a signal measurement process using a signal measurement device including: a plurality of mixers that output a signal having a frequency equal to a difference between two input frequencies; and a single local signal source that feeds a common local signal input to the plurality of mixers; the process including: a difference measurement step that measures a level difference and a phase difference between outputs of the plurality of mixers if a common correction signal input is fed to the plurality of mixers; a level/phase measurement step that measures the level and the phase of the output of the plurality of mixers if inputs of signal to be measured common in frequency are fed to the plurality of mixers; and a difference correction step that corrects a measurement result of the level/phase measurement step based on a measurement result of the difference measurement step if a common input of signal to be measured is fed to the plurality of mixers.

BRIEF DESCRIPTION OF THE DRAWINGS

FIG. 3 is a table showing an example of the measurement of the level difference and the phase difference between the outputs of the multiple mixers 14 and 24 if the common correction signal input is fed to the multiple mixers 14 and 24;

PREFERRED EMBODIMENTS

A description will now be given of an embodiment of the present invention referring to drawings.

Figure 1:
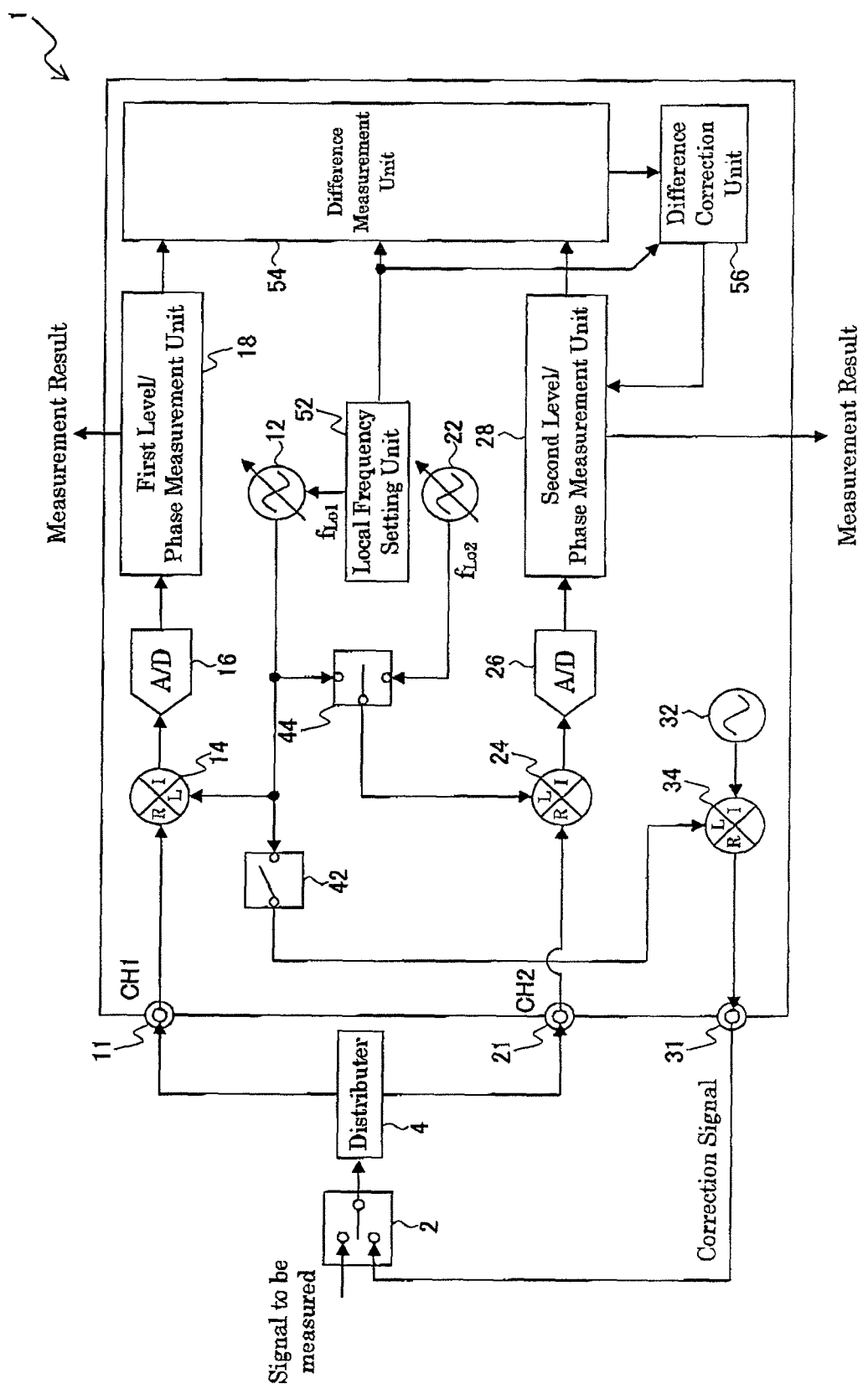
FIG. 1 is a functional block diagram showing a configuration of a signal measurement device 1 according to the embodiment of the present invention.

FIG. 1 is a functional block diagram showing a configuration of a signal measurement device 1 according to the embodiment of the present invention. A distributer 4 is connected to the signal measurement device 1. The distributer 4 is connected to a switch 2. The signal measurement device 1 includes a first terminal 11, a second terminal 21, an output terminal 31, a first local signal source 12, a first mixer 14, a first A/D converter 16, a first level/phase measurement unit 18, a second local signal source 22, a second mixer 24, a second A/D converter 26, a second level/phase measurement unit 28, an intermediate frequency signal source 32, a mixer for correction signal 34, switches 42 and 44, a local frequency setting unit 52, a difference measurement unit 54, and a difference correction unit 56. The signal measurement device 1 is a spectrum analyzer, for example.

The switch 2 receives a signal to be measured and a correction signal, and feeds either one of them to the distributor 4. The distributor 4 feeds the signal to be measured or the correction signal fed from the switch 2 to the first terminal 11 and the second terminal 21. It should be noted that the distributor 4 may be built into the signal measurement device 1.

Figure 2:
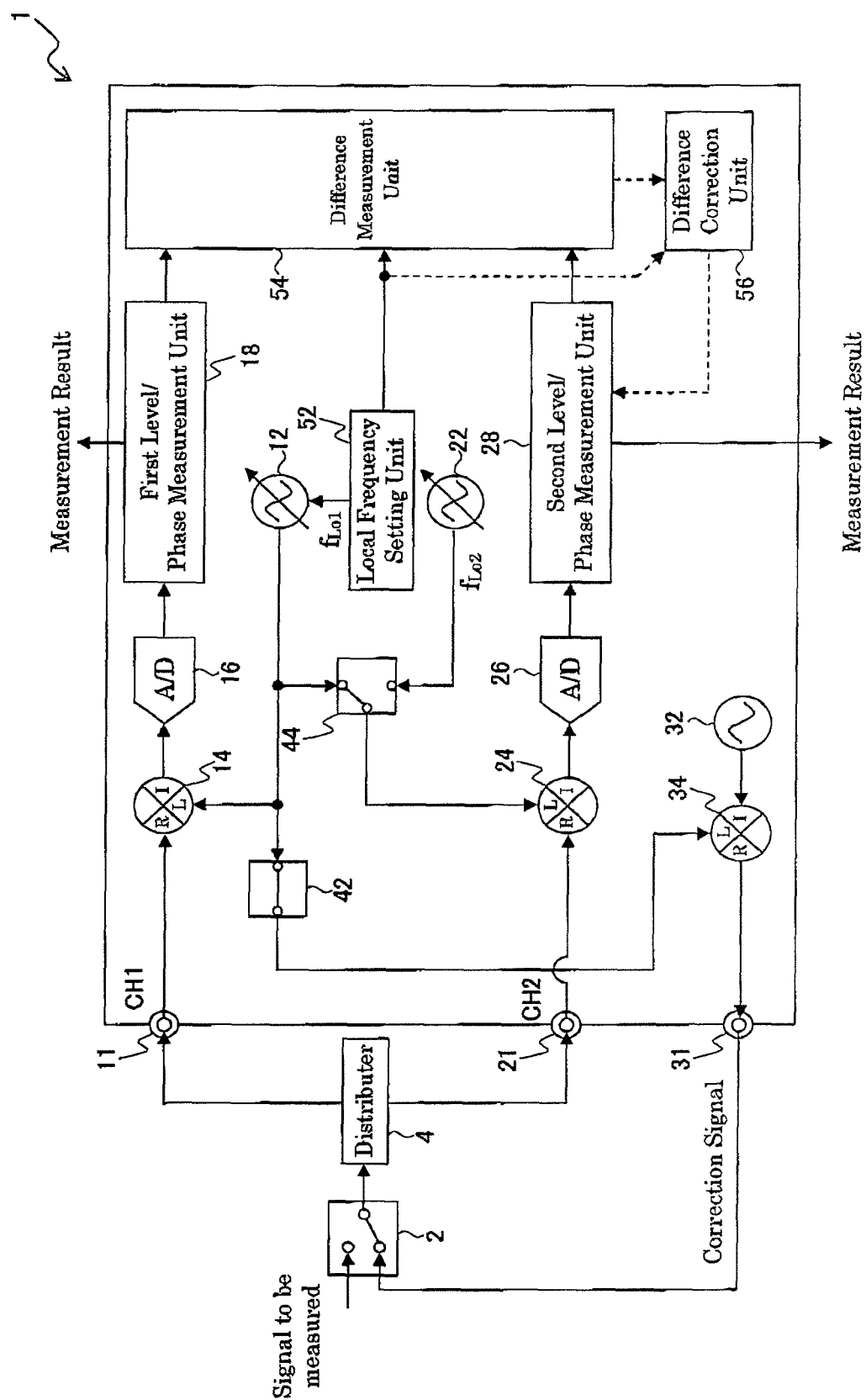
FIG. 2 is a functional block diagram showing a configuration if the correction signal is fed to the signal measurement device 1 according to the embodiment of the present invention.
Figure 5:
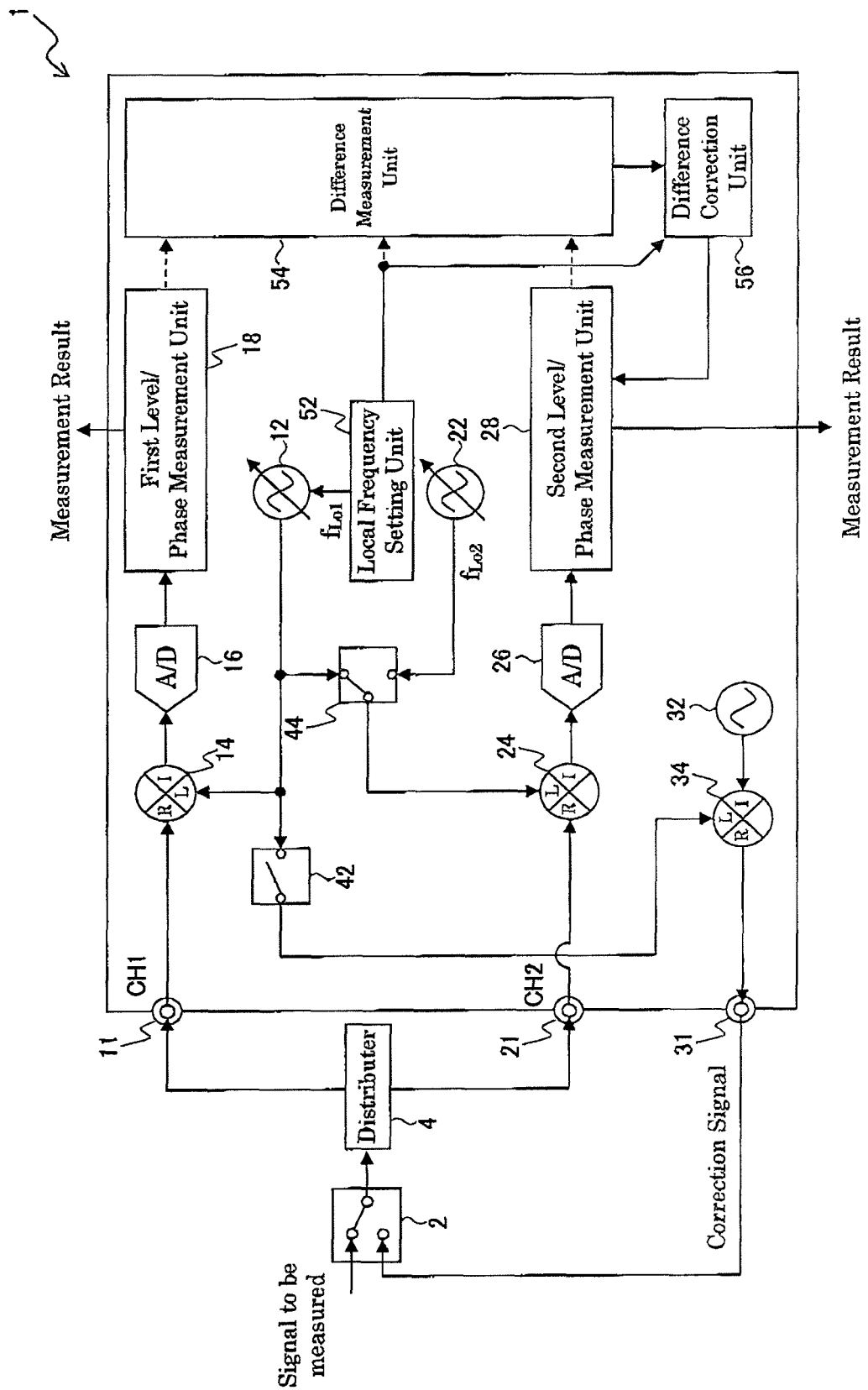
FIG. 5 is a functional block diagram showing a configuration if the signal to be measured is fed to the signal measurement device 1 according to the embodiment of the present invention.

FIG. 2 is a functional block diagram showing a configuration if the correction signal is fed to the signal measurement device 1 according to the embodiment of the present invention. FIG. 5 is a functional block diagram showing a configuration if the signal to be measured is fed to the signal measurement device 1 according to the embodiment of the present invention.

The first terminal (CH1: channel 1) 11 feeds the signal to be measured (refer to FIG. 5) or the correction signal (refer to FIG. 2) fed from the distributor 4 to the first mixer 14. The second terminal (CH2: channel 2) 21 feeds the signal to be measured (refer to FIG. 5) or the correction signal (refer to FIG. 2) fed from the distributor 4 to the second mixer 24.

The output terminal 31 outputs the correction signal. The output terminal 31 is connected to the switch 2.

The first mixer 14 outputs a signal (I output) having a frequency equal to a difference between two inputs (R input and L input). It should be noted that the R input is fed from the first terminal 11 and the L input is fed from the first local signal source 12. Moreover, the R input, the L input, and the I output respectively mean Radio Frequency input, Local input, and Intermediate Frequency output.

The second mixer 24 outputs a signal (I output) having a frequency equal to a difference between two inputs (R input and L input). It should be noted that the R input is fed from the second terminal 21, the L input is fed from the first local signal source 12 (refer to FIGS. 2 and 5), or the second local signal source 22 (refer to FIG. 6). The meanings of the R input, the L input, and the I output are the same as those of the first mixer 14.

The first local signal source 12 is a single local signal source which feeds a common local signal input to the L inputs of the multiple mixers 14 and 24 (refer to FIGS. 2 and 5). It should be noted that the frequency $f_{Lo1}$ of the local signal is variable, namely can be swept.

The first A/D converter 16 receives the I output (analog signal) of the first mixer 14, and converts the I output into a digital signal. The second A/D converter 26 receives the I output (analog signal) of the second mixer 24, and converts the I output into a digital signal.

The first level/phase measurement unit 18 measures the level and the phase of the output of the first mixer 14 if the input of signal to be measured (refer to FIG. 5) or the input of the correction signal (refer to FIG. 2) is fed in common to the multiple mixers 14 and 24. The measurement result of the first mixer 14 is fed to the difference measurement unit 54 (refer to FIG. 2), or is output to the outside of the signal measurement device 1 (refer to FIG. 5).

The second level/phase measurement unit 28 measures the level and the phase of the output of the second mixer 24 if the input of signal to be measured (refer to FIG. 5) or the input of the correction signal (refer to FIG. 2) is fed in common to the multiple mixers 14 and 24. The measurement result of the second mixer 24 is fed to the difference measurement unit 54 (refer to FIG. 2), or is output to the outside of the signal measurement device 1 (refer to FIG. 5).

It should be noted that the first level/phase measurement unit 18 and the second level/phase measurement unit 28 are implemented by DSPs (Digital Signal Processors), for example.

The second local signal source 22 is an independent local signal source associated with the second mixer 24. The frequency $f_{Lo2}$ of an output of the second local signal source 22 is variable, namely can be swept.

The intermediate frequency signal source 32 feeds the intermediate frequency signal input to the mixer for correction signal 34. The intermediate frequency signal may be the same signal as the signal to be measured as well as a pulse, a continuous wave (frequency thereof may be swept), a modulated signal, or a noise.

The local signal input (L input) and the intermediate frequency signal input (I input) are fed to the mixer for correction signal 34. Further, the mixer for correction signal 34 outputs a signal the frequency of which is equal to a sum of the frequency of the local signal input and the frequency of the intermediate frequency signal input as the correction signal (R output). The local signal input (L input) is fed from the first local signal source 12 via the switch 42. The intermediate frequency signal input (I input) is fed from the intermediate frequency signal source 32. The correction signal is fed to the output terminal 31.

It should be noted that the R output, the L input, and the I input respectively mean Radio Frequency output, Local input, and Intermediate Frequency input.

The switch 42 is a switch which switches between the state in which the first local signal source 12 is connected to the mixer for correction signal 34 (refer to FIG. 2) and the state in which the first local signal source 12 is not connected thereto (refer to FIG. 5).

Figure 6:
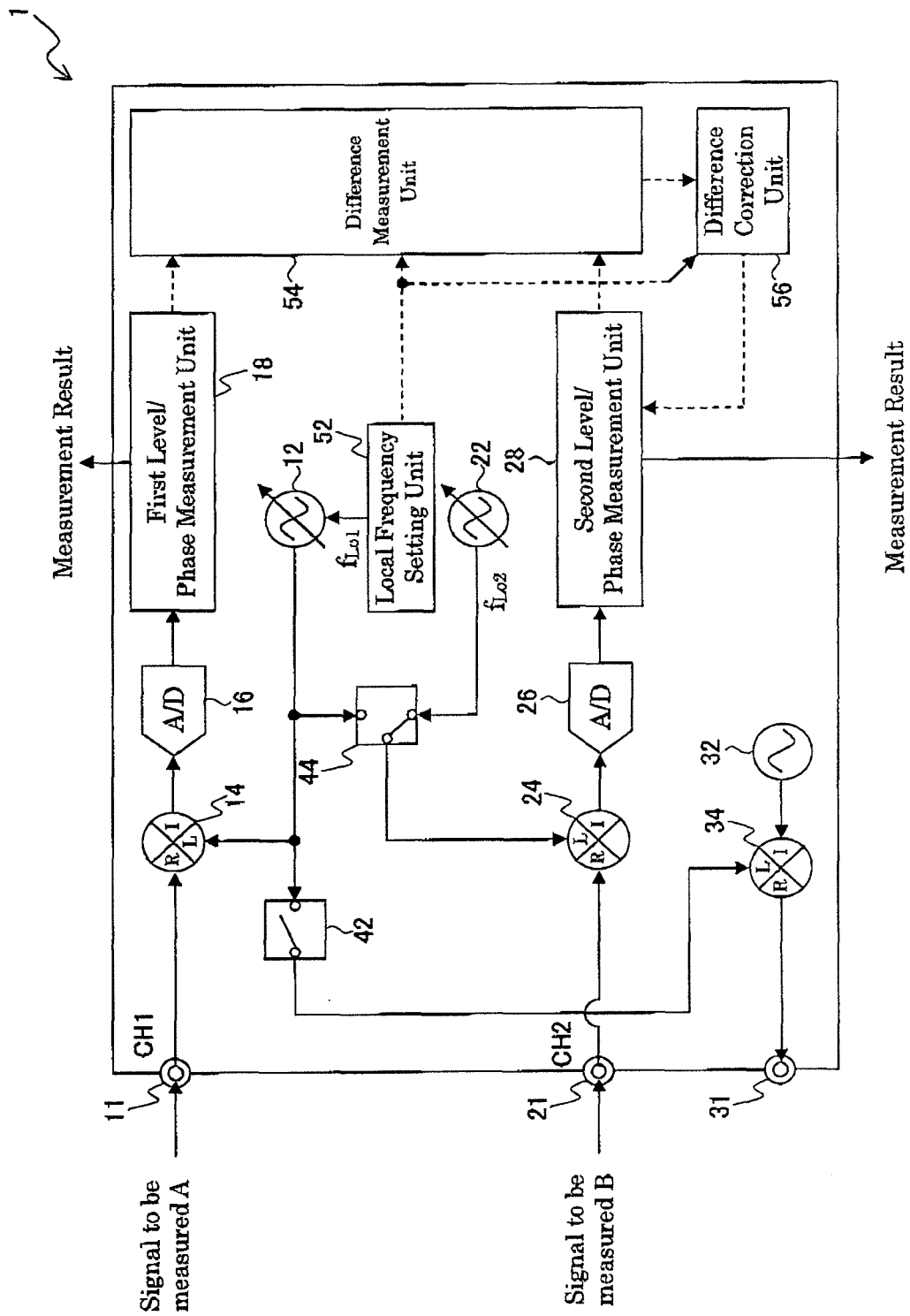
FIG. 6 is a functional block diagram showing a configuration if independent signals to be measured (inputs) A and B are fed to the signal measurement device 1 according to a first variation of the embodiment of the present invention.

The switch 44 is a switch which connects the second mixer 24 to the single local signal source 12 (refer to FIGS. 2 and 5), or to the second local signal source (independent local signal source) 22 (refer to FIG. 6). If the second mixer 24 is connected to the second local signal source 22, the first local signal source 12 serves as an independent local signal source associated with the first mixer 14 as shown in FIG. 6.

The local frequency setting unit 52 sets $f_{Lo1}$, which is the frequency of the first local signal source 12.

The difference measurement unit 54 receives the level and the phase of the output of the first mixer 14 from the first level/phase measurement unit 18, and the level and the phase of the output of the second mixer 24 from the second level/phase measurement unit 28 if the common correction signal input is fed to the multiple mixers 14 and 24 (refer to FIG. 2).

Further, the difference measurement unit 54 measures a level difference and a phase difference between the outputs of the multiple mixers 14 and 24 if the common correction signal input is fed to the multiple mixers 14 and 24 (refer to FIG. 2) based on measurement results received from the first level/phase measurement unit 18 and the second level/phase measurement unit 28.

The difference measurement unit 54 measures the level difference and the phase difference between the outputs of the multiple mixers 14 and 24 while the level difference and the phase difference are associated with the frequency $f_{Lo1}$ of the local signal input if the common correction signal input is fed to the multiple mixers 14 and 24 (refer to FIG. 2).

FIG. 3 is a table showing an example of the measurement of the level difference and the phase difference between the outputs of the multiple mixers 14 and 24 if the common correction signal input is fed to the multiple mixers 14 and 24.

The difference measurement unit 54 receives the output level of the first mixer 14 (CH1) from the first level/phase measurement unit 18 if the frequency $f_{Lo1}$ of the local signal input is f1. Moreover, the difference measurement unit 54 receives the output level of the second mixer 24 (CH2) from the second level/phase measurement unit 28 if the frequency $f_{Lo1}$ of the local signal input is f1. Further, the difference measurement unit 54 acquires and records a difference in output level (ΔLv1) therebetween (CH2−CH1). It should be noted that the difference measurement unit 54 acquires the fact that the frequency $f_{Lo1}$ of the local signal input is f1 from the local frequency setting unit 52. The difference measurement unit 54 records ΔLv1 while ΔLv1 is associated with f1.

Similarly, the difference measurement unit 54 acquires and records a difference in output level (ΔLv2) therebetween (CH2−CH1) if the frequency $f_{Lo1}$ of the local signal input is f2. It should be noted that the difference measurement unit 54 acquires the fact that the frequency $f_{Lo1}$ of the local signal input is f2 from the local frequency setting unit 52. The difference measurement unit 54 records ΔLv2 while ΔLv2 is associated with f2.

Further, the difference measurement unit 54 acquires and records a difference in output level (ΔLv3) therebetween (CH2−CH1) if the frequency $f_{Lo1}$ of the local signal input is f3. It should be noted that the difference measurement unit 54 acquires the fact that the frequency $f_{Lo1}$ of the local signal input is f3 from the local frequency setting unit 52. The difference measurement unit 54 records ΔLv3 while ΔLv3 is associated with f3.

It should be noted that f3−f2=f2−f1 and f3>f2>f1, for example.

The difference measurement unit 54 receives the output phase of the first mixer 14 (CH1) from the first level/phase measurement unit 18 if the frequency $f_{Lo1}$ of the local signal input is f1. Moreover, the difference measurement unit 54 receives the output phase of the second mixer 24 (CH2) from the second level/phase measurement unit 28 if the frequency $f_{Lo1}$ of the local signal input is f1. Further, the difference measurement unit 54 acquires and records a difference in output phase (ΔP1) therebetween (CH2−CH1). It should be noted that the difference measurement unit 54 acquires the fact that the frequency $f_{Lo1}$ of the local signal input is f1 from the local frequency setting unit 52. The difference measurement unit 54 records ΔP1 while ΔP1 is associated with f1.

Similarly, the difference measurement unit 54 acquires and records a difference in output phase (ΔP2) therebetween (CH2−CH1) if the frequency $f_{Lo1}$ of the local signal input is f2. It should be noted that the difference measurement unit 54 acquires the fact that the frequency $f_{Lo1}$ of the local signal input is f2 from the local frequency setting unit 52. The difference measurement unit 54 records ΔP2 while ΔP2 is associated with f2.

Further, the difference measurement unit 54 acquires and records a difference in output phase (ΔP3) therebetween (CH2–CH1) if the frequency $f_{Lo1}$ of the local signal input is f3. It should be noted that the difference measurement unit 54 acquires the fact that the frequency $f_{Lo1}$ of the local signal input is f3 from the local frequency setting unit 52. The difference measurement unit 54 records ΔP3 while ΔP3 is associated with f3.

The difference correction unit 56 corrects a measurement result by the second level/phase measurement unit 28 when the common input of signal to be measured is fed to the plurality of mixers 14 and 24 according to the frequency $f_{Lo1}$ of the local signal input based on a measurement result by the difference measurement unit 54 (refer to FIG. 5).

For example, the difference correction unit 56 acquires the fact that the frequency $f_{Lo1}$ of the local signal input is f1 from the local frequency setting unit 52. Further, the difference correction unit 56 reads the difference in output level ΔLv1 and the difference in output phase ΔP1 which are associated with f1 from the difference measurement unit 54. The difference correction unit 56 feeds ΔLv1 and ΔP1 to the second level/phase measurement unit 28. Then, the second level/phase measurement unit 28 outputs a result of subtraction of ΔLv1 from the output level [dBm] of the measurement result, and a result of subtraction of ΔP1 from the output phase [rad] of the measurement result as a measurement result.

The same correction is carried out for the case in which the frequency $f_{Lo1}$ of the local signal input is f2 or f3.

However, if the frequency $f_{Lo1}$ of the local signal input is not any one of f1, f2, and f3, the above-described method cannot correct the measurement result of the second level/phase measurement unit 28. In this case, the difference correction unit 56 corrects the measurement result of the second level/phase measurement unit 28 based on the measurement result of the difference measurement unit 54 interpolated in terms of the frequency $f_{Lo1}$ of the local signal input.

Figure 4:
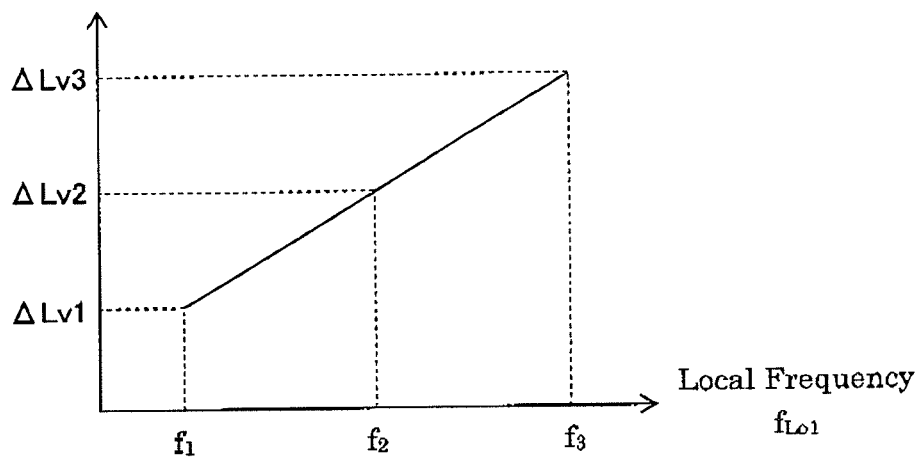
FIG. 4 is a chart showing the difference $\Delta Lv1 \sim \Delta Lv3$ in output level interpolated in terms of the frequency $f_{Lo1}$ of the local signal input (refer to FIG. 4(a)), and the difference $\Delta P1 \sim \Delta P3$ in output phase interpolated in terms of the frequency $f_{Lo1}$ of the local signal input (refer to FIG. 4(b)) if the common correction signal input is fed to the multiple mixers 14 and 24.
Figure 4:
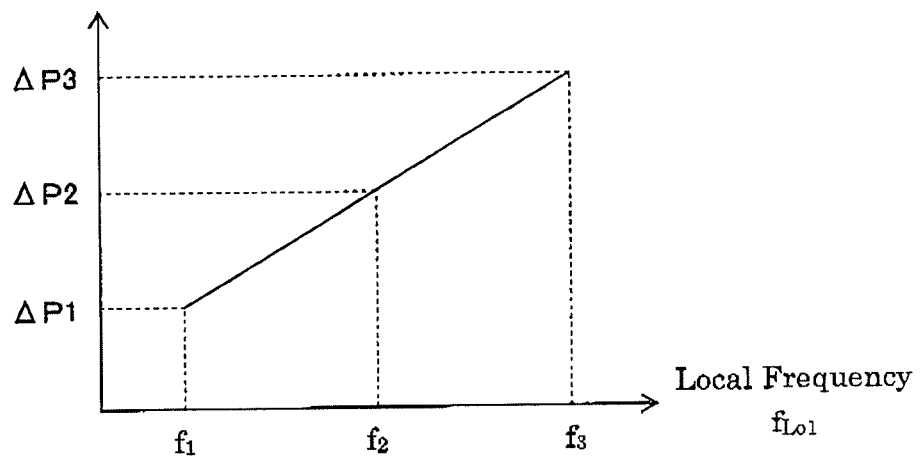

FIG. 4 is a chart showing the difference ΔLv1~ΔLv3 in output level interpolated in terms of the frequency $f_{Lo1}$ of the local signal input (refer to FIG. 4(a)), and the difference ΔP1~ΔP3 in output phase interpolated in terms of the frequency $f_{Lo1}$ of the local signal input (refer to FIG. 4(b)) if the common correction signal input is fed to the multiple mixers 14 and 24.

The output level and the output phase are interpolated by a linear function as an example in FIG. 4. Results of the interpolation of the output level and the output phase are recorded in the difference measurement unit 54.

The difference correction unit 56 acquires the value of the frequency $f_{Lo1}$ of the local signal input from the local frequency setting unit 52. The difference correction unit 56 acquires a difference in output level and a difference in output phase corresponding to this value from the interpolation results (refer to FIGS. 4(a) and 4(b)), and feeds the differences to the second level/phase measurement unit 28. Then, the second level/phase measurement unit 28 outputs subtractions of the values fed by the difference correction unit 56 respectively from the output level [dBm] and the output phase [rad] as a measurement result.

A description will now be given of an operation of the embodiment of the present invention.
(1) Input of Correction Signal (Refer to FIG. 2)

First, referring to FIG. 2, the correction signal is fed to the signal measurement device 1.

The switch 42 connects the first local signal source 12 to the L input of the mixer for correction signal 34. On this occasion, the local frequency setting unit 52 sets the frequency $f_{Lo1}$ of the first local signal source 12. Then, the local signal input (L input) is fed from the first local signal source 12 to the mixer for correction signal 34. Moreover, the intermediate frequency signal input (I input) is fed to the mixer for correction signal 34 from the intermediate frequency signal source 32.

Then, the mixer for correction signal 34 outputs a signal the frequency of which is equal to the sum of the frequency of the local signal input and the frequency of the intermediate frequency signal input as the correction signal (R output). The correction signal is output from the output terminal 31, and is fed to the distributor 4 via the switch 2. The distributor 4 feeds the correction signal fed from the switch 2 to the first terminal 11 and the second terminal 21.

On this occasion, the switch 44 connects the second mixer 24 to the single local signal source 12.

The correction signal fed to the first terminal (CH1) 11 is fed to the R input of the first mixer 14. The local signal input from the local signal source 12 is fed to the L input of the first mixer 14. Then, the signal (I output) having the frequency equal to the difference in frequency between the two inputs (R input and L input) is output from the first mixer 14. The frequency of the I output is the frequency of the intermediate frequency signal output by the intermediate frequency signal source 32.

The I output (analog signal) of the first mixer 14 is converted into the digital signal by the first A/D converter 16, and is fed to the first level/phase measurement unit 18. The first level/phase measurement unit 18 measures the level and the phase of the output of the first mixer 14, and feeds the level and the phase to the difference measurement unit 54.

The correction signal fed to the second terminal (CH2) 21 is fed to the R input of the second mixer 24. The local signal input from the local signal source 12 is fed to the L input of the second mixer 24. Then, the signal (I output) having the frequency equal to the difference in frequency between the two inputs (R input and L input) is output from the second mixer 24. The frequency of the I output is the frequency of the intermediate frequency signal output by the intermediate frequency signal source 32.

The I output (analog signal) of the second mixer 24 is converted into the digital signal by the second A/D converter 26, and is fed to the second level/phase measurement unit 28. The second level/phase measurement unit 28 measures the level and the phase of the output of the second mixer 24, and feeds the level and the phase to the difference measurement unit 54.

It should be noted that the value of the frequency $f_{Lo1}$ of the local signal input is fed from the local frequency setting unit 52 to the difference measurement unit 54.

The same correction signal is fed both to the first mixer 14 and the second mixer 24, it is thus ideal that the output level and the output phase, which are the measurement result of the first level/phase measurement unit 18 and the output level and the output phase, which are the measurement result of the second level/phase measurement unit 28 are equal to each other.

However, actually, though the same correction signal is fed both to the first mixer 14 and the second mixer 24, the output level and the output phase, which are the measurement result of the first level/phase measurement unit 18 and the output level and the output phase, which are the measurement result of the second level/phase measurement unit 28 are different from each other. Actually, this is because there are differences between an electrical length and an attenuation of an electric circuit from the local signal source 12 to the first mixer 14 and an electrical length and an attenuation of an electric circuit from the local signal source 12 to the second mixer 24.

The difference measurement unit 54 measures the level difference ΔLv1~ΔLv3 and the phase difference ΔP1~ΔP3 between the outputs of the multiple mixers 14 and 24 while the level difference ΔLv1~ΔLv3 and the phase difference ΔP1~ΔP3 are associated with the frequency $f_{Lo1}$ of the local signal input (refer to FIG. 3) if the common correction signal input is fed to the multiple mixers 14 and 24 (refer to FIG. 2).

The level difference between the outputs of the multiple mixers 14 and 24 is a difference between the output level, which is the measurement result of the first level/phase measurement unit 18 and the output level, which is the measurement result of the second level/phase measurement unit 28.

Moreover, the phase difference between the outputs of the multiple mixers 14 and 24 is a difference between the output phase, which is the measurement result of the first level/phase measurement unit 18 and the output phase, which is the measurement result of the second level/phase measurement unit 28.

The difference measurement unit 54 acquires and records the difference ΔLv1~ΔLv3 in output level interpolated in terms of the frequency $f_{Lo1}$ of the local signal input (refer to FIG. 4(a)), and the difference ΔP1~ΔP3 in output phase interpolated in terms of the frequency $f_{Lo1}$ of the local signal input (refer to FIG. 4(b)).

(2) Input of Signal to be Measured (Refer to FIG. 5)

Then, referring to FIG. 5, a signal to be measured is fed to the signal measurement device 1.

The signal to be measured is fed to the distributor 4 via the switch 2. The distributor 4 feeds the signal to be measured fed from the switch 2 to the first terminal 11 and the second terminal 21.

On this occasion, the switch 44 connects the second mixer 24 to the single local signal source 12.

The signal to be measured fed to the first terminal (CH1) 11 is fed to the R input of the first mixer 14. The local signal input from the local signal source 12 is fed to the L input of the first mixer 14. Then, the signal (I output) having the frequency equal to the difference in frequency between the two inputs (R input and L input) is output from the first mixer 14.

The I output (analog signal) of the first mixer 14 is converted into the digital signal by the first A/D converter 16, and is fed to the first level/phase measurement unit 18. The first level/phase measurement unit 18 measures the level and the phase of the output of the first mixer 14, and outputs a result thereof to the outside of the signal measurement device 1.

The signal to be measured fed to the second terminal (CH2) 21 is fed to the R input of the second mixer 24. The local signal input from the local signal source 12 is fed to the L input of the second mixer 24. Then, the signal (I output) having the frequency equal to the difference in frequency between the two inputs (R input and L input) is output from the second mixer 24.

The I output (analog signal) of the second mixer 24 is converted into the digital signal by the second A/D converter 26, and is fed to the second level/phase measurement unit 28. The second level/phase measurement unit 28 measures the level and the phase of the output of the second mixer 24.

Moreover, the difference correction unit 56 acquires the value of the frequency $f_{Lo1}$ of the local signal input from the local frequency setting unit 52. Further, the difference correction unit 56 reads the differences in output level and the differences in output phase corresponding to the frequency of the local signal input from the difference measurement unit 54.

If the value of the frequency of the local signal input is any one of f1, f2, and f3, it is only necessary for the difference correction unit 56 to read any one of the actually measured value ΔLv1~ΔLv3, and any one of the actually measured value ΔP1~ΔP3 (refer to FIG. 3) of the difference measurement unit 54.

If the frequency $f_{Lo1}$ of the local signal input is not any one of f1, f2, and f3, the difference correction unit 56 acquires the differences in output level and the differences in output phase corresponding to the frequency $f_{Lo1}$ of the local signal input from the interpolated results (refer to FIGS. 4(a) and 4(b)) recorded in the difference measurement unit 54.

The difference correction unit 56 provides the second level/phase measurement unit 28 with the read differences in output level and differences in output phase. Then, the second level/phase measurement unit 28 outputs subtractions of the values fed by the difference correction unit 56 respectively from the output level [dBm] and the output phase [rad] as a measurement result.

As a result, it is possible to correct the errors between the measurement results by the first level/phase measurement unit 18 and the second level/phase measurement unit 28 caused by the differences between the electrical length and the attenuation of the electric circuit from the local signal source 12 to the first mixer 14 and the electrical length and the attenuation of the electric circuit from the local signal source 12 to the second mixer 24.

It should be noted that the correction by the difference correction unit 56 is not necessary if there are no level difference and phase difference between the outputs of the first mixer 14 and the second mixer 24 when the common input of signal to be measured is fed to the first mixer 14 and the second mixer 24.

According to the embodiment of the present invention, the output of the single local signal source 12 is used as the local signal for the spectrum analyzer (signal measurement device 1) including the multiple channels (CH1, CH2). Therefore, since the fluctuations in phase of the local signal in the respective channels are common, the inconsistency in phase of the local signal can be reduced compared with the conventional case which uses the multiple local signal sources 12 and 22.

Moreover, the errors between the measurement results by the first level/phase measurement unit 18 and the second level/phase measurement unit 28 caused by the differences between the electrical length and the attenuation of the electric circuit from the local signal source 12 to the first mixer 14 and the electrical length and the attenuation of the electric circuit from the local signal source 12 to the second mixer 24 are recorded in the difference measurement unit 54 while the errors are associated with the value of the frequency $f_{Lo1}$ of the local signal input. The errors are read by the difference correction unit 56, and are fed to the second level/phase measurement unit 28, thereby correcting the measurement results, and the above-mentioned errors can thus be corrected.

According to the embodiment of the present invention, it is possible to handle the inconsistency in level and phase of the local signal in respective channels in a spectrum analyzer having multiple channels.

Though there are two channels in the embodiment of the present invention, the number of channels may be three or more. The A/D converter and the level/phase measurement unit may be provided for each of the channels, and the local signal input may be fed from the local signal source 12 to each of the mixers. Moreover, mixers on two or more stages may be provided for each of the channels.

Moreover, the following variations of the embodiment of the present invention are conceivable.

First Variation

FIG. 6 is a functional block diagram showing a configuration if independent signals to be measured (inputs) A and B are fed to the signal measurement device 1 according to a first variation of the embodiment of the present invention.

The independent signals to be measured (inputs) A and B may be fed to the multiple mixers 14 and 24 in the signal measurement device 1 according to the embodiment of the present invention as shown in FIG. 6. It should be noted that the frequencies of the signals to be measured (inputs) A and B may be different from each other.

The switch 44 connects the second mixer 24 to the second local signal source (independent local signal source) 22 (refer to FIG. 6). In this case, the first local signal source 12 is an independent local signal source associated with the first mixer 14. It should be noted that the switch 42 connects between the first local signal source 12 and the mixer for correction signal 34.

The signal to be measured (input) A is fed to the R input of the first mixer 14. The output from the first local signal source 12 is fed to the L input of the first mixer 14. The first A/D converter 16 receives the I output (analog signal) of the first mixer 14, and converts the I output into a digital signal. The first level/phase measurement unit 18 measures the level and the phase of the output of the first mixer 14. The measurement result of the first mixer 14 is output to the outside of the signal measurement device 1.

The signal to be measured (input) B is fed to the R input of the second mixer 24. The output from the second local signal source 22 is fed to the L input of the second mixer 24. The second A/D converter 26 receives the I output (analog signal) of the second mixer 24, and converts the I output into a digital signal. The second level/phase measurement unit 28 measures the level and the phase of the output of the second mixer 24. The measurement result of the second mixer 24 is output to the outside of the signal measurement device 1.

Second Variation

Figure 7:
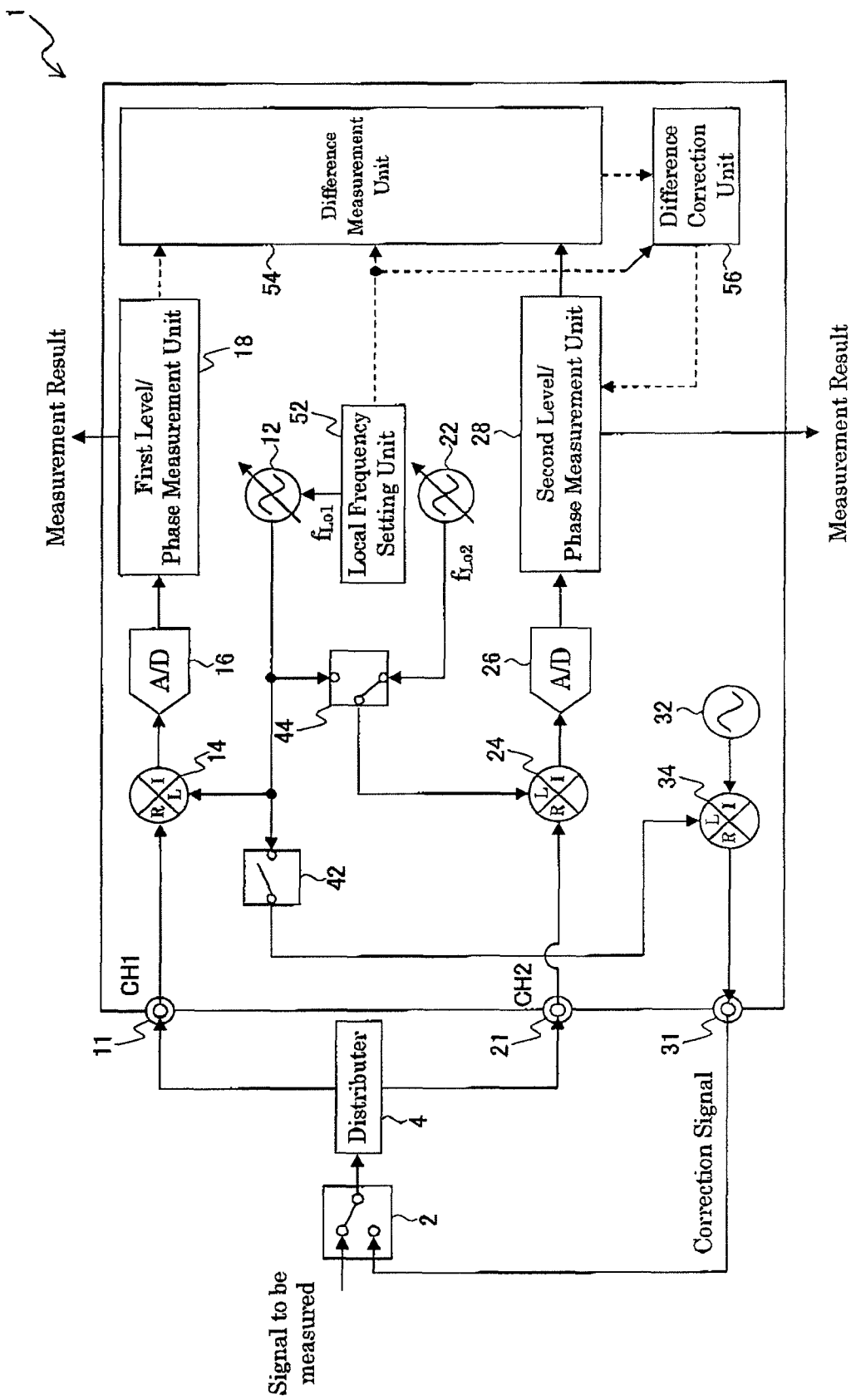
FIG. 7 is a functional block diagram showing a configuration if a common input of signal to be measured is fed to the multiple mixers 14 and 24 while the second mixer 24 is connected to the second local signal source (independent local signal source) 22 in the signal measurement device 1 according to a second variation of the embodiment of the present invention.

FIG. 7 is a functional block diagram showing a configuration if a common input of signal to be measured is fed to the multiple mixers 14 and 24 while the second mixer 24 is connected to the second local signal source (independent local signal source) 22 in the signal measurement device 1 according to a second variation of the embodiment of the present invention.

As shown in FIG. 7, the common input of signal to be measured may be fed to the multiple mixers 14 and 24 while the second mixer 24 is connected to the second local signal source (independent local signal source) 22 in the signal measurement device 1 according to the second variation of the embodiment of the present invention.

In other words, if the phase difference and the level difference between the signal fed from the first local signal source 12 to the first mixer 14 and the signal fed from the second local signal source 22 to the second mixer 24 can be zero, the difference measurement unit 54 and the difference correction unit 56 may not be used.

Third Variation

The signal to be measured is fed to the first terminal 11 and the second terminal 21 via the switch 2 and the distributor 4 as shown in FIG. 5 according to the embodiment of the present invention. However, independent signals to be measured A and B may be respectively fed to the first terminal 11 and the second terminal 21. It should be noted that the signal to be measured A and the signal to be measured B have the same frequency.

Figure 8:
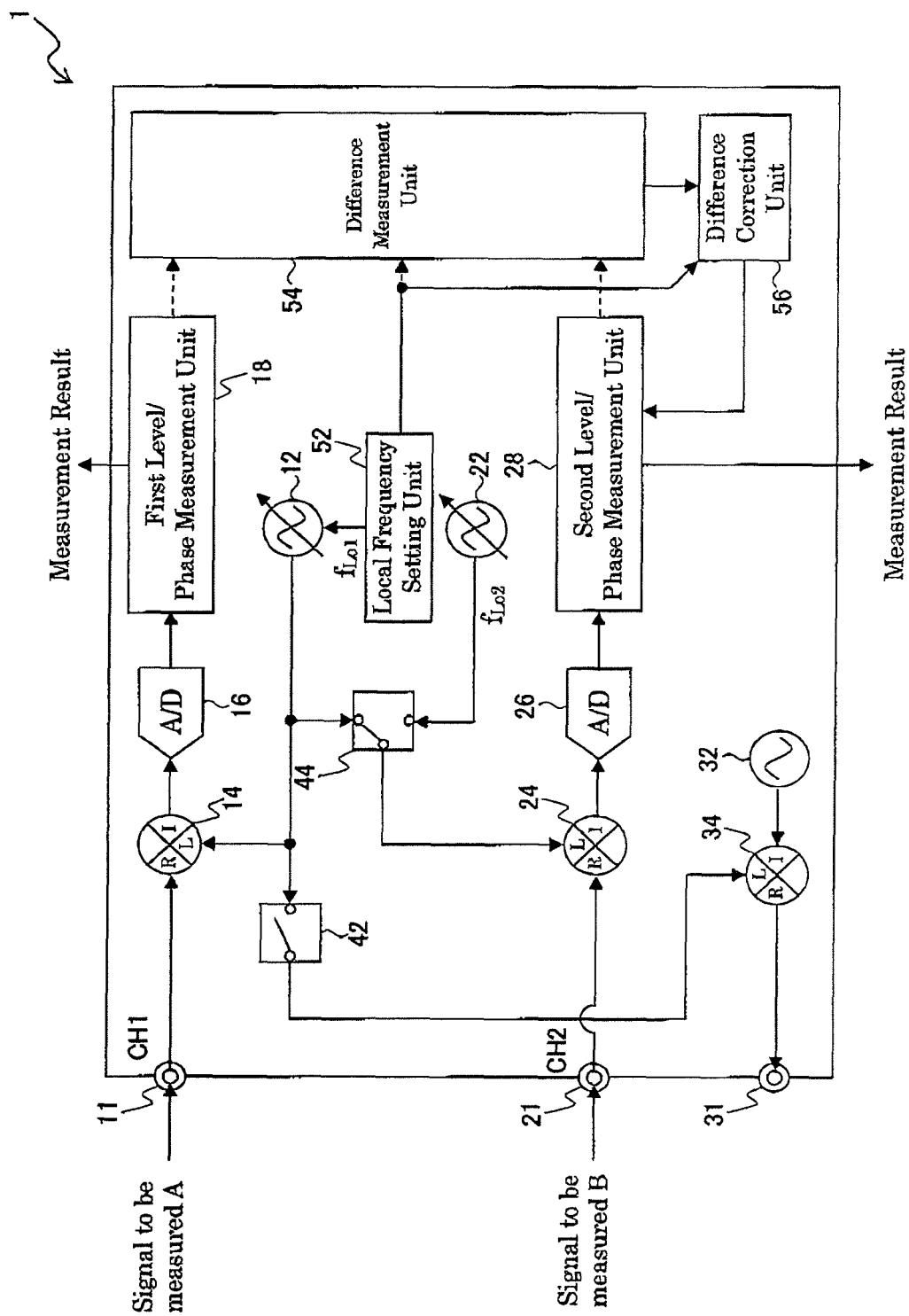
FIG. 8 is a functional block diagram showing a configuration if the signals to be measured A and B having the same frequency are fed to the signal measurement device 1 according to a third variation of the embodiment of the present invention.

FIG. 8 is a functional block diagram showing a configuration if the signals to be measured A and B having the same frequency are fed to the signal measurement device 1 according to a third variation of the embodiment of the present invention. The signal to be measured A is fed to the first terminal 11, and the signal to be measured B is fed to the second terminal 21. The other configuration and operation of the signal measurement device 1 are the same as the configuration and operation of the embodiment of the present invention shown in FIG. 5.

Moreover, the above-described embodiments may be realized in the following manner. A computer is provided with a CPU, a hard disk, and a media (such as a floppy disk (registered trade mark) and a CD-ROM) reader, and the media reader is caused to read a medium recording a program realizing the above-described respective components such as the first level/phase measurement unit 18, the second level/phase measurement unit 28, the difference measurement unit 54, and the difference correction unit 56, thereby installing the program on the hard disk. This method may also realize the above-described functions.

The invention claimed is:

1. A signal measurement device, comprising:
   a plurality of mixers that each output a signal having a frequency equal to a difference between two input frequencies;
   a single local signal source that feeds a common local signal input to the plurality of mixers;
   a difference measurement unit that measures a level difference and a phase difference between outputs of the plurality of mixers when a common correction signal input is fed to the plurality of mixers;
   a level/phase measurement unit that measures the level and the phase of the output of each of the plurality of mixers when each common local signal input to be measured has a common frequency and each common local signal input to be measured is fed to the plurality of mixers; and
   a difference correction unit that corrects a measurement result of the level/phase measurement unit based on a measurement result of the difference measurement unit when the common local signal input to be measured is fed to the plurality of mixers.

2. The signal measurement device according to claim 1, wherein:
   the difference measurement unit measures the level difference and the phase difference while the level difference and the phase difference are associated with a frequency of the common local signal input; and
   the difference correction unit corrects the measurement result of the level/phase measurement unit according to the frequency of the common local signal input.

3. The signal measurement device according to claim 2, wherein the difference correction unit corrects the measurement result of the level/phase measurement unit based on the measurement result of the difference measurement unit interpolated based on the frequency of the common local signal input.

4. The signal measurement device according to claim 1, further comprising a mixer for common correction signal input that receives the common local signal input and an intermediate frequency signal input, and outputs a signal having a frequency equal to a sum of the frequency of the common local signal input and the frequency of the intermediate frequency signal input as the common correction signal input.

5. The signal measurement device according to claim 1, further comprising:
   independent local signal sources that are respectively associated with the plurality of mixers; and
   a switch that connects the plurality of mixers respectively with the single local signal source or the independent local signal sources.

6. A signal measurement device, comprising:
a plurality of mixers that each output a signal having a frequency equal to a difference between two input frequencies;
a single local signal source that feeds a common local signal input to the plurality of mixers; and
a level/phase measurement unit that measures the level and the phase of the output of each of the plurality of mixers when each common local signal input to be measured has a common frequency and each common local signal input is fed to the plurality of mixers, wherein when there is no level difference and no phase difference between outputs of the plurality of mixers and the common local signal input to be measured is fed to the plurality of mixers, there is no correction on a measurement result of the level/phase measurer.

7. A signal measurement method using a signal measurement device including: a plurality of mixers that each output a signal having a frequency equal to a difference between two input frequencies; and a single local signal source that feeds a common local signal input to the plurality of mixers;
said method comprising:
measuring a level difference and a phase difference between outputs of the plurality of mixers when a common correction signal input is fed to the plurality of mixers;
measuring the level and the phase of the output of the plurality of mixers when each common local signal input to be measured has a common frequency and is fed to the plurality of mixers; and
correcting a measurement result of the measured level and phase of the output based on a measurement result of the measured level difference and phase difference when the common local signal input to be measured is fed to the plurality of mixers.

8. The signal measurement method according to claim 7, further comprising:
measuring the level difference and the phase difference while the level difference and the phase difference are associated with a frequency of the common local signal input; and
correcting the measurement result of the level difference and phase difference according to the frequency of the common local signal input.

9. The signal measurement method according to claim 8, further comprising correcting the measurement result of the level difference and phase difference based on the measurement result of the measured difference interpolated based on the frequency of the common local signal input.

10. The signal measurement method according to claim 7, further comprising receiving the common local signal input and an intermediate frequency signal input, and outputting a signal having a frequency equal to a sum of the frequency of the common local signal input and the frequency of the intermediate frequency signal input as the common correction signal input.

11. The signal measurement method according to claim 7, further comprising:
associating independent local signal sources, respectively, with the plurality of mixers; and
connecting the plurality of mixers, respectively, with the single local signal source or the independent local signal sources.

12. A non-transitory computer-readable medium storing a program for execution by a computer to perform a signal measurement process using a signal measurement device including: a plurality of mixers that each output a signal having a frequency equal to a difference between two input frequencies; and a single local signal source that feeds a common local signal input to the plurality of mixers;
said process comprising:
measuring a level difference and a phase difference between outputs of the plurality of mixers when a common correction signal input is fed to the plurality of mixers;
measuring the level and the phase of the output of the plurality of mixers when each common local signal input to be measured has a common frequency and is fed to the plurality of mixers; and
correcting a measurement result of the measured level and phase of the output based on a measurement result of the measured level difference and phase difference when the common local signal input to be measured is fed to the plurality of mixers.

* * * * *